(12) United States Patent
Lim

(10) Patent No.: US 7,990,359 B2
(45) Date of Patent: Aug. 2, 2011

(54) OPTICAL DETECTION APPARATUS, LIQUID CRYSTAL DISPLAY DEVICE USING THE SAME AND DRIVING METHOD THEREOF

(75) Inventor: Kyoung Moon Lim, Gwanginyeong-si (KR)

(73) Assignee: LG Display Co., Ltd., Seoul (KR)

( * ) Notice: Subject to any disclaimer, the term of this patent is extended or adjusted under 35 U.S.C. 154(b) by 1301 days.

(21) Appl. No.: 11/594,949

(22) Filed: Nov. 9, 2006

(65) Prior Publication Data

US 2007/0257879 A1  Nov. 8, 2007

(30) Foreign Application Priority Data

May 4, 2006  (KR) .................. 10-2006-0040465

(51) Int. Cl.
G09G 3/36  (2006.01)
(52) U.S. Cl. .................. 345/102; 345/55; 345/207
(58) Field of Classification Search .......... 345/102, 345/207, 55
See application file for complete search history.

(56) References Cited

U.S. PATENT DOCUMENTS

| | | | |
|---|---|---|---|
| 5,481,118 A * | 1/1996 | Tew | 250/551 |
| 5,936,231 A * | 8/1999 | Michiyama et al. | 250/214 A |
| 6,486,726 B1 * | 11/2002 | Worley et al. | 327/514 |
| 2007/0132749 A1 * | 6/2007 | Peng et al. | 345/207 |
| 2008/0031031 A1 * | 2/2008 | Okuda | 365/112 |

* cited by examiner

Primary Examiner — Richard Hjerpe
Assistant Examiner — Leonid Shapiro
(74) Attorney, Agent, or Firm — McKenna Long & Aldridge LLP

(57) ABSTRACT

An optical detection apparatus includes an optical/electric converter to transduce light incident on the optical/electric converter into a current flowing to a ground potential; a current mirror to supply a mirror output voltage to a current mirror output node in response to an enable signal, the mirror output voltage having a magnitude proportional to the light intensity incident on the optical/electric converter; and a switch to connect a driving node of the current mirror to the ground potential through the optical/electric converter in response to the enable signal.

19 Claims, 5 Drawing Sheets

OPTICAL DETECTION APPARATUS, LIQUID CRYSTAL DISPLAY DEVICE USING THE SAME AND DRIVING METHOD THEREOF

This application claims the benefit of Korean Patent Application No. P06-0040465, filed on May 4, 2006, which is hereby incorporated by reference for all purposes as if fully set forth herein.

BACKGROUND OF THE INVENTION

1. Field of the Invention

The present invention relates to an optical detection apparatus and a liquid crystal display device using the same, and more particularly to an optical detection apparatus and a liquid crystal display device and a driving method using the apparatus for automatically adjusting a light amount irradiated onto a liquid crystal display panel.

2. Discussion of the Related Art

A liquid crystal display device (LCD) controls light transmittance of liquid crystal cells in accordance with video signals to thereby display a picture. An active matrix type of liquid crystal display device having a switching device provided for each liquid crystal cell is particularly well suited for displaying moving pictures through active control of the switching devices. The primary switching device used for active matrix liquid crystal display devices is the thin film transistor (hereinafter, referred to as "TFT") as shown in FIG. 1.

As shown in FIG. 1, in a typical active matrix LCD device digital input data is converted into an analog data voltage using a gamma reference voltage and the analog data voltage is supplied to a data line DL while a scanning pulse is supplied to a gate line GL resulting in charging a liquid crystal cell Clc with the analog data voltage.

A gate electrode of the TFT is connected to the gate line GL, while a source electrode of the TFT is connected to the data line DL. Further, a drain electrode of the TFT is connected to a pixel electrode of the liquid crystal cell Clc and to one electrode of a storage capacitor Cst.

A common electrode of the liquid crystal cell Clc is supplied with a common voltage Vcom.

The storage capacitor Cst is charged by a data voltage fed from the data line DL when the TFT is turned-on and maintains the data voltage at the liquid crystal cell Clc until a new data voltage is feed from the data line DL.

When the scanning pulse is applied to a gate line GL, the TFT is turned on to provide a channel between the source electrode and the drain electrode of the TFT to connect a voltage on the data line DL to the pixel electrode of the liquid crystal cell Clc. The alignment of the liquid crystal molecules of the liquid crystal cell is varied by an electric field generated between the pixel electrode and the common electrode to modulate light transmitted through the liquid crystal display device to display an image.

A liquid crystal display device of the related art including pixels having the above-mentioned structure will be described with reference to FIG. 2.

FIG. 2 is a block diagram showing a configuration of a related art liquid crystal display device.

As shown in FIG. 2, the related art liquid crystal display device 100 includes: a liquid crystal display panel 110 provided with a thin film transistor (TFT) for driving the liquid crystal cell Clc at crossings of data lines DL1 to DLm and gate lines GL1 to GLn; a data driver 120 for supplying a data to the data lines DL1 to DLm of the liquid crystal display panel 110; a gate driver 130 for supplying a scanning pulse to the gate lines GL1 to GLn of the liquid crystal display panel 110; a gamma reference voltage generator 140 for generating a gamma reference voltage to supply to the data driver 120; a backlight assembly 150 for irradiating a light onto the liquid crystal display panel 110; an inverter 160 for applying an alternating current voltage and a current to the backlight assembly 150; a common voltage generator 170 for generating a common voltage Vcom for supply to the common electrode of the liquid crystal cell Clc of the liquid crystal display panel 110, a gate driving voltage generator 180 for generating a gate high voltage VGH and a gate low voltage VGL for supply to the gate driver 130; and a timing controller 190 for controlling the data driver 120 and the gate driver 130.

The liquid crystal display panel 110 has liquid crystal injected or disposed between two glass substrates. On the lower glass substrate of the liquid crystal display panel 110, the data lines DL1 to DLm and the gate lines GL1 to GLn cross each other and are substantially perpendicular. Each crossing between one of the data lines DL1 to DLm and one of the gate lines GL1 to GLn defines a liquid crystal cell Clc has an associated TFT. The TFTs connect data on the data lines DL1 to DLm to liquid crystal cells Clc in response to the scanning pulse. The gate electrode of each TFT is connected to one of the gate lines GL1 to GLn while the source electrode thereof is connected to one of the data line DL1 to DLm. Further, the drain electrode of each TFT is connected to the pixel electrode of the associated liquid crystal cell Clc and to the storage capacitor Cst.

A TFT is turned-on in response to the scanning pulse applied to the gate electrode of the TFT via the gate lines GL1 to GLn. Upon turning-on of the TFT, a video data on the data lines DL1 to DLm is supplied to the pixel electrode of the liquid crystal cell Clc.

The data driver 120 supplies data to the data lines DL1 to DLm in response to a data driving control signal DDC supplied from the timing controller 190. In particular, the data driver 120 samples and latches digital video data RGB fed from the timing controller 190, and converts the digital video data RGB into an analog data voltage capable of expressing a gray scale level at the liquid crystal cell Clc of the liquid crystal display panel 110 based on a gamma reference voltage from the gamma reference voltage generator 140. The data driver supplies the analog digital video data to the data lines DL1 to DLm.

The gate driver 130 generates a scanning pulse, (i.e. gate pulse) in response to a gate driving control signal GDC and a gate shift clock GSM supplied from the timing controller 190, the scanning pulse to be sequentially supplied to the gate lines GL1 to GLn. The gate driver 130 establishes a high level voltage and a low level voltage for the scanning pulse in accordance with the gate high voltage VGH and the gate low voltage VGL supplied from the gate driving voltage generator 180.

The gamma reference voltage generator 140 receives a high-level supply voltage VDD for generating a positive gamma reference voltage and a negative gamma reference voltage and outputs the positive and negative gamma reference voltages to the data driver 120.

The backlight assembly 150 is provided at the rear side of the liquid crystal display panel 110 and is energized by an alternating current (AC) voltage and current supplied from the inverter 160 to irradiate light onto each pixel of the liquid crystal display panel 110.

The inverter 160 converts a rectangular wave signal generated within the inverter into a triangular wave signal and then compares the triangular wave signal with a direct current power voltage VCC to generate a burst dimming signal proportional to a result of the comparison. The burst dimming signal is supplied to a driving integrated circuit (IC) to control generation of the AC voltage and current within the inverter to be supplied to the backlight assembly 150.

The common voltage generator 170 receives a high-level power voltage VDD to generate a common voltage Vcom and supplies the common voltage Vcom to the common electrode of the liquid crystal cell Clc provided at each pixel of the liquid crystal display panel 110.

The gate driving voltage generator 180 is supplied with a high-level power voltage VDD to generate the gate high voltage VGH and the gate low voltage VGL and supplies the gate high voltage VGH and the gate low voltage VGL to the gate driver 130. The gate driving voltage generator 180 generates a gate high voltage VGH greater than a threshold voltage of the TFT provided at each pixel of the liquid crystal display panel 110 and a gate low voltage VGL less than then the threshold voltage of the TFT. The gate high voltage VGH and the gate low voltage VGL generated in this manner are used to establish the high level voltage and the low level voltage of the scanning pulse generated by the gate driver 130, respectively.

The timing controller 190 supplies a digital video data RGB received from a source such as a digital video card to the data driver 120 and, at the same time, generates a data driving control signal DCC and a gate driving control signal GDC using horizontal/vertical synchronizing signals H and V in response to a clock signal CLK. The data driving control signal DCC and a gate driving control signal GDC are to be supplied to the data driver 120 and the gate driver 130, respectively. The data driving control signal DDC includes a source shift clock SSC, a source start pulse SSP, a polarity control signal POL, and a source output enable signal SOE. The gate driving control signal GDC includes a gate start pulse GSP and a gate output enable signal GOE.

Because the backlight assembly 150 is supplied with a constant current from the inverter 160, the backlight assembly emits light having a constant intensity regardless of the amount of ambient light in the environment of the liquid crystal display panel 110. However in a dark environment, a user may comfortably view an image displayed by the liquid crystal using a reduced amount of light from the backlight assembly 150. Accordingly, because the related art liquid crystal display device 100 irradiates a light having a constant intensity onto the liquid crystal display panel 110 regardless of brightness of the environment, an avoidably large amount of power may be consumed by the backlight assembly 150. Further, an image displayed at the liquid crystal display panel 110 may appear relatively dim when the environment surrounding the liquid crystal display panel 100 is brightly lit. Increasing the light intensity emitted onto the liquid crystal display panel 110 in a bright environment may provide a more comfortable viewing of the displayed image by users. However, because the related art liquid crystal display device 100 irradiates a light having a constant intensity onto the liquid crystal display panel 110, the related art liquid crystal display device 100 may not present a satisfactory image to the user in brightly lit environments.

SUMMARY OF THE INVENTION

Accordingly, the present invention is directed to an optical detection apparatus and liquid crystal display device using the same and a driving method thereof that substantially obviates one or more of the problems due to limitations and disadvantages of the related art.

An advantage of the present invention is to provide an optical detection apparatus that is capable of integration on a thin substrate.

Another advantage of the present invention is to provide a liquid crystal display device and a driving method for automatically adjusting an amount of light irradiated into a liquid crystal display panel in accordance with a light intensity detected by the optical detection apparatus.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposes of the present invention, as embodied and broadly described, an optical detection apparatus optical detection apparatus for controlling the backlight of a liquid crystal display device includes an optical/electric converter to transduce light incident on the optical/electric converter into a current flowing to a ground potential; a current mirror to supply a mirror output voltage to a current mirror output node in response to an enable signal, the mirror output voltage having a magnitude proportional to the light intensity incident on the optical/electric converter; and a switch to connect a driving node of the current mirror to the ground potential through the optical/electric converter in response to the enable signal.

In another aspect of the present invention, a liquid crystal display device includes an optical detector to output a detector voltage in proportion to the light intensity in response to an enable signal; a driving controller to output a driving control signal according to the detector voltage and a burst dimming signal; a lamp driver to converting a supply voltage into a lamp driving current having a magnitude varying according with the driving control signal.

In another aspect of the present invention, a method of driving a liquid crystal display device includes providing an optical detector including: an optical/electric converter transducing light incident on the optical/electric converter into a current flowing to a ground potential; a current mirror supplying a mirror output voltage to a current mirror output node in response to an enable signal, the mirror output voltage having a magnitude proportional to the light intensity incident on the optical/electric converter; and a switch connecting a driving node of the current mirror to the ground potential through the optical/electric converter in response to the enable signal; generating a voltage in proportion to light emitted from lamps onto a liquid crystal display panel in response to an enable signal; generating a lamp driving control signal to controlling the amount of light emitted by the lamps correlated with a magnitude of the voltage; and controlling the magnitude of a lamp driving current supplied to the lamps in accordance with the lamp driving control signal when the lamps are energized to emit light.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, examples of which is illustrated in the accompanying drawings.

Figure 3:
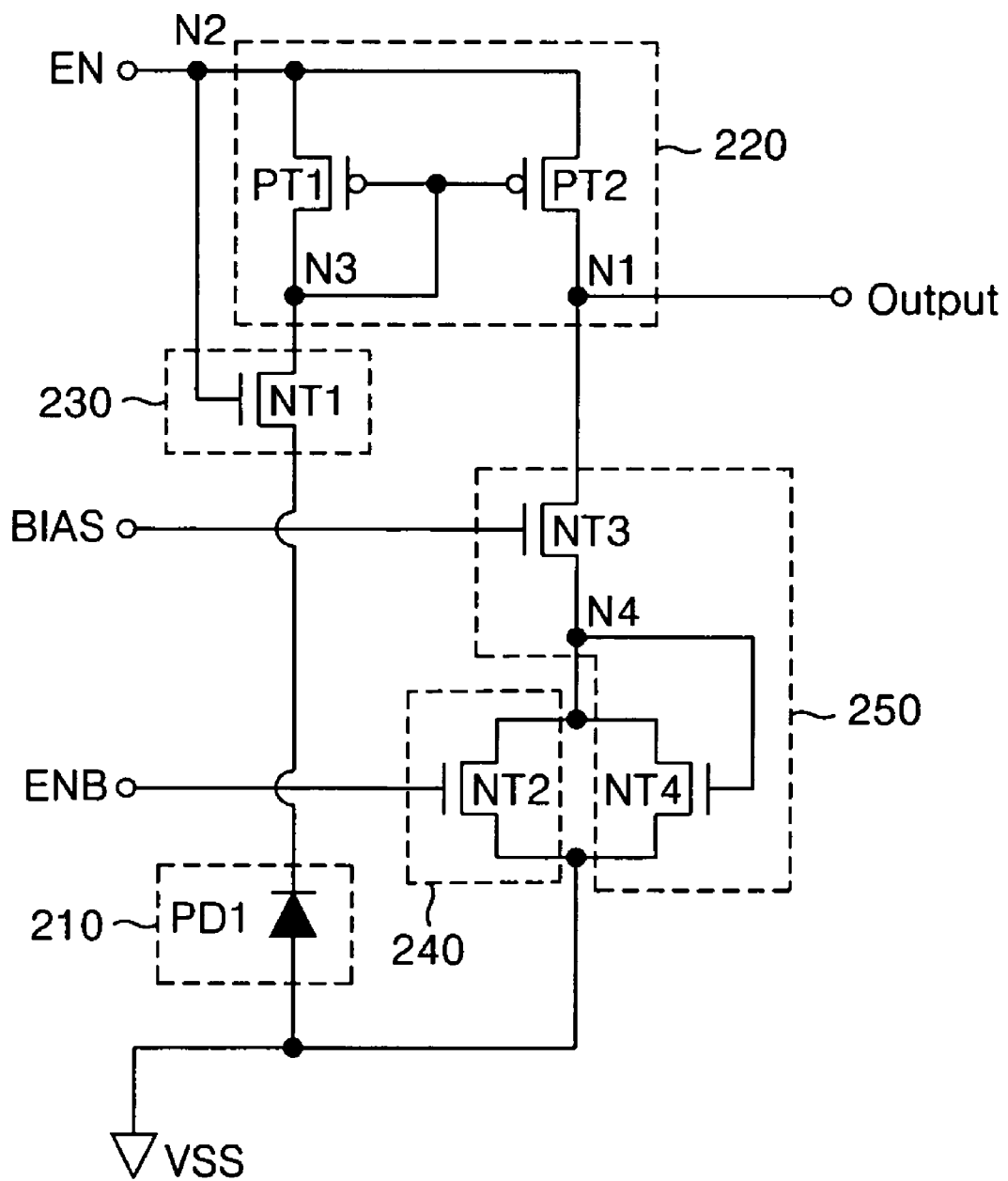
FIG. 3 is a circuit diagram of an optical detection apparatus according to an embodiment of the present invention.

FIG. 3 is a circuit diagram of an optical detection apparatus according to an embodiment of the present invention.

Referring to FIG. 3, an optical detection apparatus 200 of the present invention includes an optical/electric converter 210 for receiving light and transducing the received light into a current flow to a ground potential VSS, a current mirror 220 for outputting a high-level voltage derived from an inputted enable signal EN or a low-level voltage of an inverted enable signal ENB to an output portion, and a switch 230 to conduct a driving voltage of the current mirror 220 into the ground connected to the optical/electric converter 210 in response to a high-voltage of the inputted enable signal EN.

The optical detection apparatus 200 of the present invention further includes a reset portion 240 to respond to a high-voltage of the inputted inverted enable signal ENB to switch a voltage supplied to an output node N1 of the current mirror 220 that is connected to the output portion into the ground and a load generating unit 250 for driving by the applied bias to convert a current mirrored by the current mirror into at the output node N1 of the current mirror 220.

Herein, the enable signal EN and the inverted enable signal ENB are supplied from a system employing the optical detection apparatus 200, for example, a liquid crystal display device, a touch screen or a scan device, and a bias signal is supplied from a bias generator included in the system employing the optical detection apparatus 200.

The optical/electric converter 210 may include a photo diode PD1 having an anode connected to a ground potential and a cathode connected to the switch 230 so that the photo diode PD1 operates in a reverse biased or inverse current mode.

When ambient light from the surroundings is incident onto the photo diode PD1, the photo diode PD1 converts or transduces the incident light into a current flowing to the ground potential VSS. The magnitude of the current flow to the ground potential is directly related and substantially proportional to the light intensity incident on the photo diode PD1. In other words, the size of the current produced by the photo diode PD1 increases as the light intensity incident on the photo diode PD1 is increased and decreases with decreasing light intensity incident on the photo diode PD1.

The flow of current is in proportion to the magnitude of a resistance value of the circuit. Thus when the effective resistance of the circuit is low, the circuit is sufficient to provide the amount the current to be supplied to the ground by the photo diode PD1 and is insufficient to supply the current to be supplied to the ground by the photo diode PD1 if the effective resistance of the circuit is high. Accordingly, when the amount of current supplied to ground through the photo diode PD1 increases due to an increase in light intensity received by the photo diode PD1, then to decrease the effective resistance limiting the current flow the driving voltage of the current mirror 220 supplied via the switch 230 increases. On the other hand, when the amount of current supplied to ground through the photo diode PD1 decreases due to a decrease in light intensity received by the photo diode PD1, then to increase the effective resistance limiting the current flow, the driving voltage of the current mirror 220 supplied via the switch 230 decreases.

The optical/electric converter 210 may be implemented using an optical/electric converting or transducing device other than a photo diode such as an N-MOS transistor. When the optical/electric converter 210 is implemented using an N-MOS transistor, a biasing potential is applied to the gate of the N-MOS transistor and a drain and a source of the N-MOS transistor are connected respectively to the switch 230 and the ground potential VSS.

The current mirror 220 comprises a first and second P-MOS transistor PT1 and PT2 connected in a parallel mirroring arrangement as described hereinafter such that substantially same current flows in each P-MOS transistor of the current mirror 220.

The first P-MOS transistor PT1 includes a source connected to a node N2 that is supplied with the enable signal EN, and a drain and a gate commonly connected to a node N3 that is supplied with a driving voltage of the first and second P-MOS transistor PT1 and PT2. Because the drain and gate of the first P-MOS transistor PT1 are commonly connected to the node N3, the first P-MOS transistor PT1 is maintained in a turn-on state.

The second P-MOS transistor PT2 includes a source connected to the node N2 that is supplied with the enable signal EN, a drain connected to the output node N1 and a gate connected to the node N3 that is supplied with a driving voltage of the first and second P-MOS transistor PT1 and PT2. Because the gate of the second P-MOS transistor PT2 is connected to a gate of the first P-MOS transistor PT1 that is supplied with a low-level voltage, then the second P-MOS transistor PT2 is maintained in a turned-on state to conduct the enable signal EN supplied to the node N2 to the output node N1.

The switch 230 is implemented using N-MOS transistor NT1 that includes a gate connected to the node N2 that is supplied with the enable signal EN, a drain connected to the node N3 and a source connected to a cathode of the photo diode PD1. The N-MOS transistor NT1 is turned on by a high-level voltage of the enable signal EN supplied to the gate of NT1 to switch a driving voltage of the first and second P-MOS transistor PT1 and PT2 at node N3 to the ground through the photo diode PD1.

The driving voltage supplied to the gates of the first and second P-MOS transistor PT1 and PT2 decreases as a voltage switched to node N3 by the N-MOS transistor NT1 increases. The decreased driving voltage results in a widening of the channel width of the second P-MOS transistor PT2 to increase high-level voltage of the enable signal EN supplied via the second P-MOS transistor PT2 to the output node N1. As described above, because the voltage switched applied to node N3 by the N-MOS transistor NT1 is in proportion to the light intensity incident onto the photo diode PD1, a high-level voltage of the enable signal EN supplied via the second P-MOS transistor PT2 to the output node N1 increases as the light intensity incident onto the photo diode PD1 increases.

On the other hand, the driving voltage supplied to the gates of the first and second P-MOS transistor PT1 and PT2 increases as a voltage switched to node N3 by the N-MOS transistor NT1 decreases. The increased driving voltage results in a narrowing of the channel width of the second P-MOS transistor PT2 to decrease high-level voltage of the enable signal EN supplied via the second P-MOS transistor PT2 to the output node N1. As described above, because the voltage switched applied to node N3 by the N-MOS transistor NT1 is in proportion to the light intensity incident onto the photo diode PD1, a high-level voltage of the enable signal EN supplied via the second P-MOS transistor PT2 to the output node N1 decreases as the light intensity incident onto the photo diode PD1 decreases A reset portion 240 includes a second N-MOS transistor NT2 having a gate connected to an input node supplied with the inverted enable signal ENB, a drain connected to a node N4 included in the load generating unit 250 and a source connected to the ground.

The second N-MOS transistor NT2 is driven by a high-level voltage of the inverted enable signal ENB supplied to the gate of the second N-MOS transistor NT2 to switch and reset a voltage supplied to the output node N1 of the current mirror 220 connected to the output portion into the when a low-level voltage of the enable signal EN is supplied to the optical detection apparatus 200. An optical detecting operation is carried out in response to a high-level voltage of the enable signal EN and subsequently the voltage supplied to the output node N1 is entirely removed in response to a high-level voltage of the inverted enable signal prior to the initiation of a subsequent optical detecting operation to thereby prevent an output voltage at node N2 generated in a first optical detecting operation from interfering with the output voltage generated during a subsequent optical detecting operation.

The load generating unit 250 is driven by bias signal BIAS and includes a third and fourth N-MOS transistor NT3 and NT4 connected in series between the output node N1 and the ground VSS to develop the voltage supplied to the output node N1 from the mirrored current of the current mirror 220.

The third N-MOS transistor NT3 includes a gate connected to an input node to which the bias signal BIAS is applied, a drain connected to the output node N1 and a source connected to the node N4.

The fourth N-MOS transistor NT4 includes a gate and a drain commonly connected to the node N4, respectively and a source connected to the ground.

Figure 4:
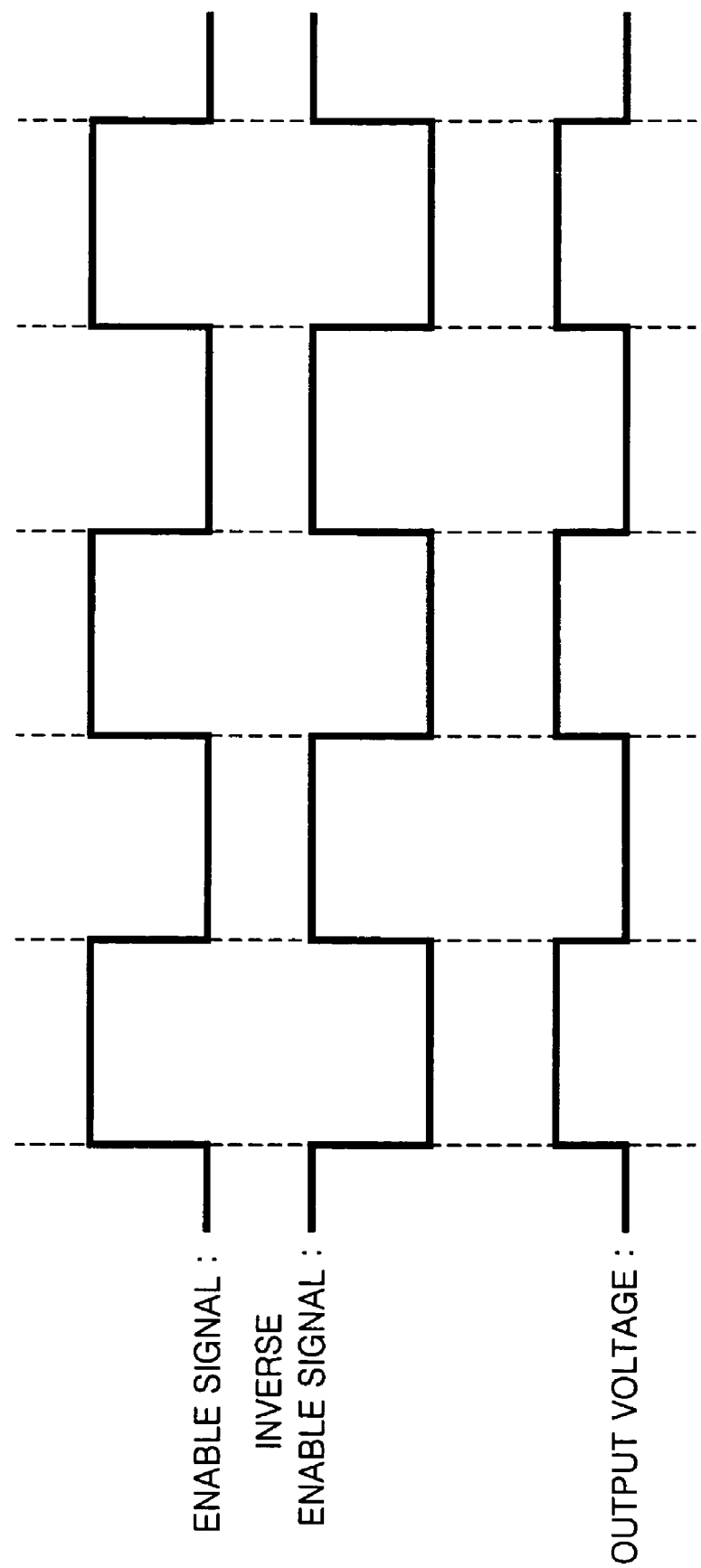
FIG. 4 is a signal characteristics diagram of an optical detection apparatus according to an embodiment of the present invention.

An operation of the optical detection apparatus having the above-mentioned configurations and functions will be described with reference to signal characteristics shown in FIG. 4. In addition to the enable EN and inverted enable ENB signal waveforms shown in FIG. 4, a bias signal BIAS having a constant level is supplied from the system to a gate of the fourth N-MOS transistor NT4.

When a high-level voltage of the enable signal EN from the system is applied to a gate of the first N-MOS transistor NT1 and a low-level voltage of the inverted enable signal ENB from the system is applied to the second N-MOS transistor NT2, when light is incident onto the photo diode PD1, the first N-MOS transistor NT1 is turned-on to conduct a driving voltage to the gates of the first and second P-MOS transistor PT1 and PT2 supplied to the node N3 to ground VSS through the photo diode PD1 while the second N-MOS transistor NT2 is turned-off.

A high-level voltage of the enable signal EN is conducted via the second P-MOS transistor PT2 to the output node N1 when a driving voltage of the first and second P-MOS transistor PT1 and PT2 is conducted via the photo diode PD1 of the first N-MOS transistor NT1, to the ground. As has been described above, the magnitude of the voltage output via the output node N1 is in proportion to the channel width of the second P-MOS transistor PT2, so that the magnitude of the output voltage at node N1 increases as the intensity of the light incident on the photo diode PD1 increases and decreases as the intensity of the light incident on the photo diode PD1 decreases.

When a low-level voltage of the enable signal EN from the system is applied to a gate of the first N-MOS transistor NT1 and a high-level voltage of the inverted enable signal ENB from the system is supplied to the second N-MOS transistor NT2, the first N-MOS transistor NT1 is turned-off to allow a driving voltage of the first and second P-MOS transistor PT1 and PT2 supplied to the node N3 to increase, and the second N-MOS transistor NT2 is turned-on. While the low-level voltage of the enable signal EN is supplied to the output node N1, the optical detection apparatus 200 does not provide an output voltage related to the light received by the photo diode PD1 from the surrounding environment. The second N-MOS transistor NT2 is driven by a high-level voltage of the inverted enable signal ENB supplied to the gate of the second N-MOS transistor NT2 to switch and reset a voltage supplied to the output node N1 of the current mirror 220 connected to the output node to the ground potential VSS.

The above-described optical detection apparatus 200 may be formed on a thin substrate allowing the optical detection apparatus 200 to be easily integrated into a liquid crystal display device, a touch screen, or a scan device. Accordingly, liquid crystal display devices may be manufactured to include the optical detection apparatus in lieu of using a separately purchased an optical detection component to thus allow reducing overall manufacturing costs.

Hereinafter, an optical detection apparatus having the above-described configuration and function applied to a system including a liquid crystal display device will be described.

Figure 1:
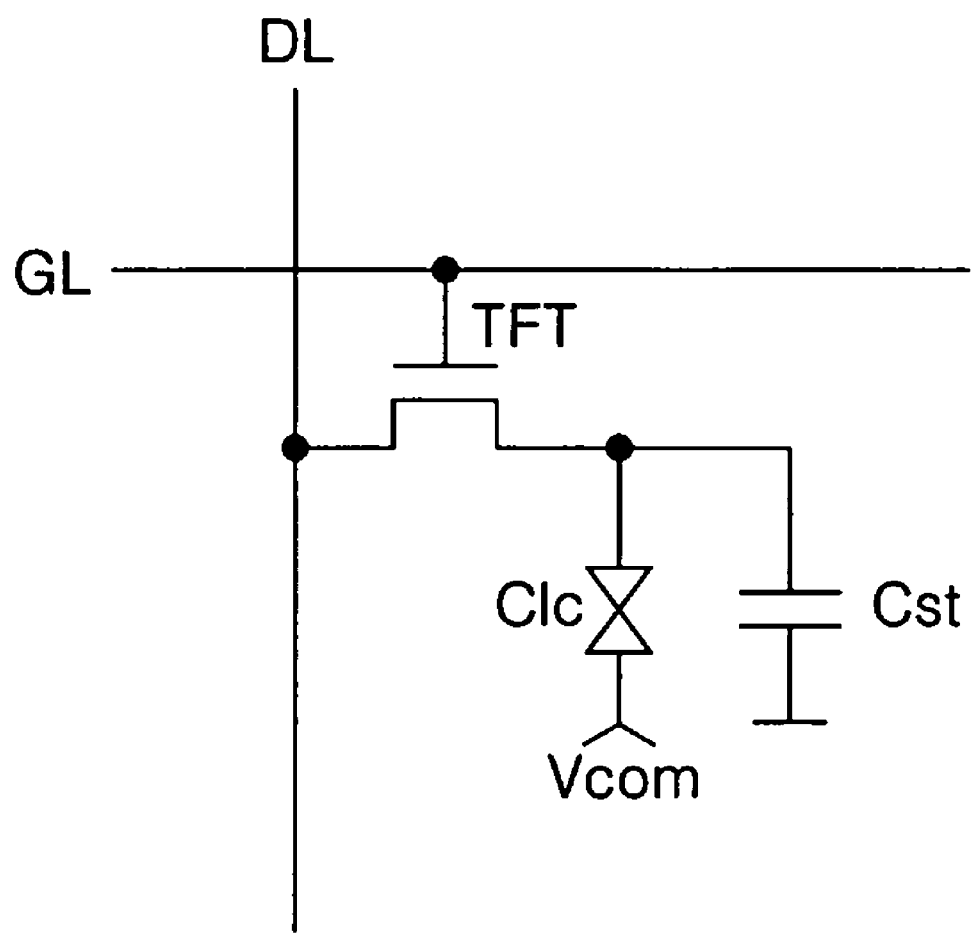
FIG. 1 is an equivalent circuit diagram of a pixel provided at a related art liquid crystal display device.
Figure 2:
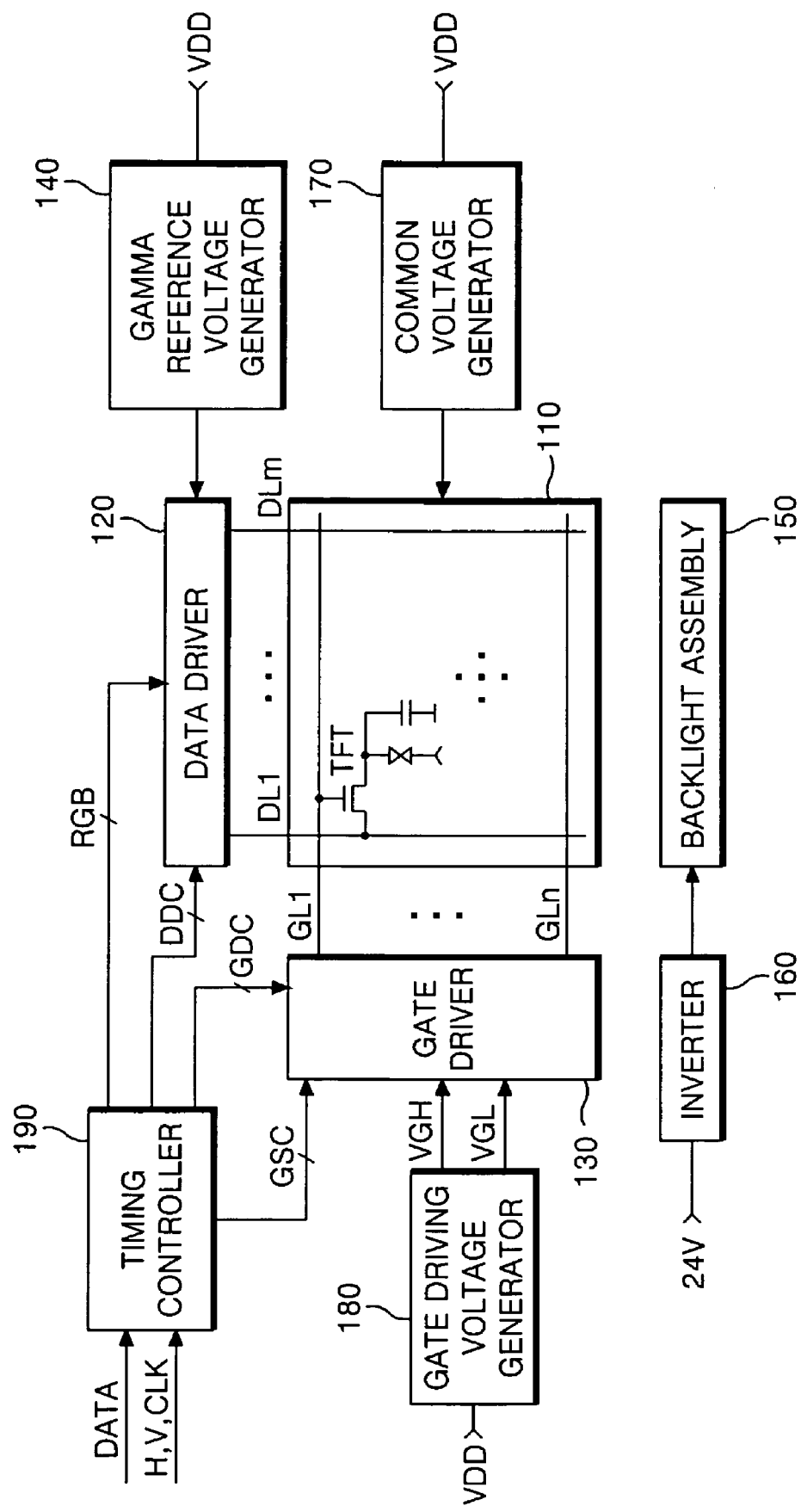
FIG. 2 is a block diagram showing a configuration of a related art liquid crystal display device.
Figure 5:
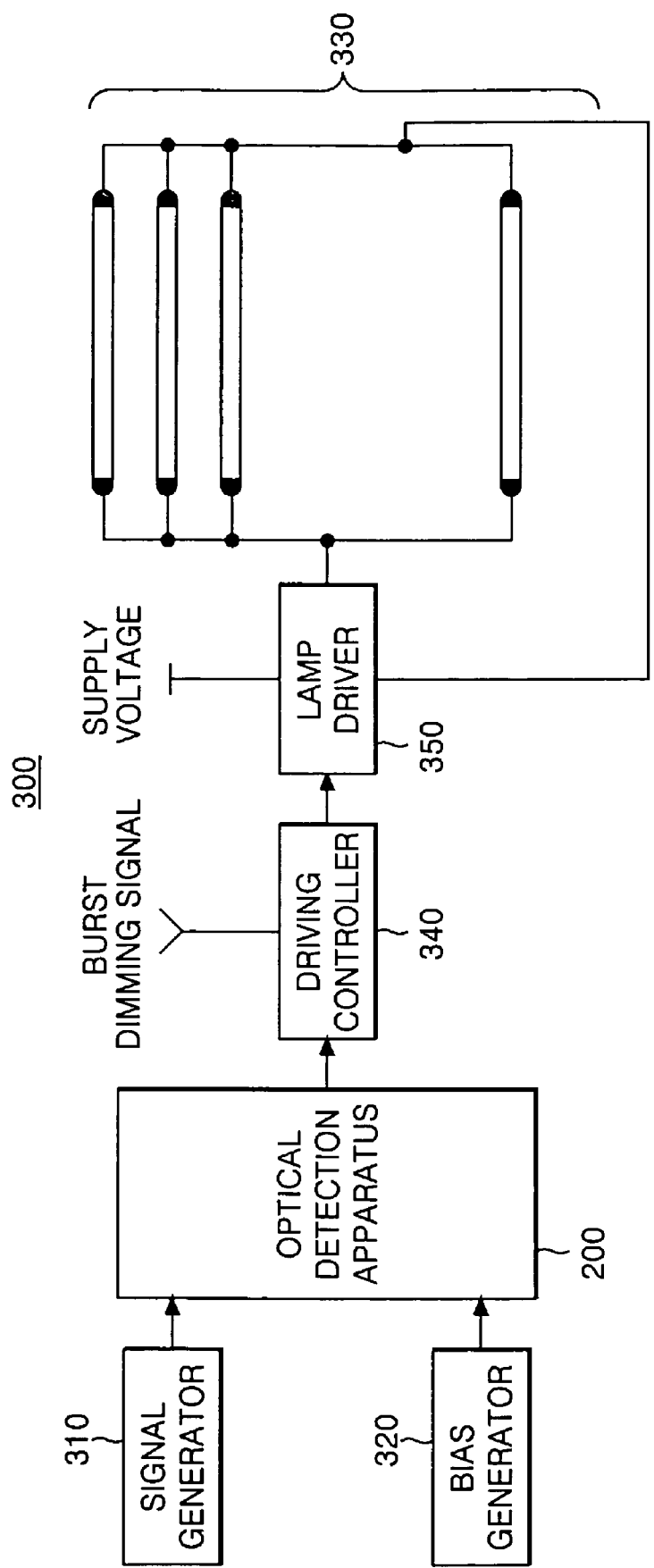
FIG. 5 is a block diagram showing a configuration of a liquid crystal display device using an optical detection apparatus according to the embodiment of the present invention.

FIG. 5 is a block diagram showing a configuration of a liquid crystal display device using an optical detection apparatus according to an embodiment of the present invention. The optical detection apparatus 200 shown in FIG. 5 includes a liquid crystal display panel 110, a data driver 120, the gate driver 130, a gamma reference voltage generator 140, a common voltage generator 170, a gate driving voltage generator 180 and the timing controller 190 identical to those shown in FIG. 2. A detailed description of the optical detection apparatus components will be omitted for clarity of presentation.

As illustrated in FIG. 5, a liquid crystal display device 300 of the present invention includes: a signal generator 310 for generating the enable signal EN and the inverted enable signal ENB; a bias generator 320 for generating a bias signal BIAS; a plurality of lamps 330 for generating light to be irradiated onto the liquid crystal display panel 110; the optical detection apparatus 200 for receiving the enable signal EN to output a voltage proportional to an light intensity detected by the optical detection apparatus 200; a driving controller 340 to output a control signal in accordance with a burst dimming signal and in accordance with an output of the optical detection apparatus 200; and a lamp driver 350 for converting a supply voltage into a lamp driving current to be supplied to the lamps 330, and to increase or decrease a magnitude of the lamp driving current in accordance with the control signal output by the driving controller 340.

The signal generator 310 alternately generates a high-level voltage of the enable signal EN and a high-level voltage of the inverted enable signal ENB, the enable signal EN and the inverted enable signal ENB each having a constant period for supply to the optical detection apparatus 200 whenever the lamps 330 are energized to emit light. The signal generator 310 may generate the enable signal EN and the inverted enable signal ENB in response to a signal generating control signal input to the signal generator 310 from an external source. Alternatively, the signal generator 310 may generate the enable signal EN and the inverted enable signal ENB in response to a control signal from the timing controller 190. Alternatively the signal generator 310 may not be separately implemented and the timing controller 190 may be implemented to generate the enable signal EN and the inverted enable signal ENB.

The bias generator 320 is designed to continuously generate a constant bias voltage BIAS and to supply the bias voltage BIAS to the optical detection apparatus 200.

The plurality of lamps 330 are uniformly spaced apart and are disposed at the rear surface of the liquid crystal display panel 110. The lamps 330 are energized by the lamp driving current supplied from the lamp driver 350 to irradiate light onto the liquid crystal display panel 110. The lamp driver 350 is configured to output a lamp driving current increasing in inverse proportion to the magnitude of a voltage output from the optical detection apparatus 200 resulting in the light intensity emitted by the lamps 350 increasing substantially in proportion to the light intensity detected by the optical detection apparatus 200.

The optical detection apparatus 200 is driven by a high-level voltage of the enable signal EN supplied from the signal generator 310 and a bias supplied from the bias generator 320 to detect light irradiated from the plurality of lamps 330 and light present in the environment surrounding the liquid crystal display panel 110 and to generate a signal voltage having a magnitude directly proportional to the detected light and then output the generated signal voltage to the driving controller 340. The configuration and an operation of the optical detection apparatus 200 is as described above with reference to FIG. 3.

The driving controller 340 generates a lamp driving control signal in accordance with the burst dimming signal and a magnitude of a signal voltage received from the optical detection apparatus 200 and supplies the lamp driving control signal to the lamp driver 350. The lamp driving control signal controls is supplied to the lamp driver 350 to control the drive current of the lamps 330 to thereby control the brightness of the lamps 330. Herein, the driving controller 340 generates a lamp driving control signal for controlling lamp driver 250 in such a manner to reduce the lamp driving current as the voltage signal output from the optical detection apparatus 200 increases and to increase the lamp driving current as the voltage signal output from the optical detection apparatus 200 decreases.

The lamp driver 350 converts a supply voltage supplied from the system into a lamp driving current in accordance with a lamp driving control signal supplied from the driving controller 340 to supply to the lamps 330.

In other words, if the environment surrounding the liquid crystal display panel 110 is dimly lit, then a voltage output from the optical detection apparatus 200 decreases. In response, the lamp driver 350 under the control of the lamp driver 340 increases a lamp driving current in accordance with a lamp driving control signal. On the other hand, if the surrounding environment of the liquid crystal display panel 110 is bright, then a voltage from the optical detection apparatus 200 is increased. Thus, the lamp driver 350 decreases a lamp driving current in accordance with a lamp driving control signal. Accordingly, the present invention may reduce the amount of light emitted by the lamps 330 in a bright environment to minimize or reduce power consumption and may increase the amount of light irradiated from the lamps 330 in a dark environment to facilitate viewing of an image.

As described above, the present invention automatically adjusts the light intensity irradiated onto the liquid crystal display panel of the liquid crystal display device in accordance with brightness of the surroundings, reducing a light intensity irradiated into the liquid crystal display panel in a bright environment to reduce or minimize consumption of power, and increasing a light intensity irradiated into the liquid crystal display panel in a dark environment to provide a bright picture to the user.

In addition, the light intensity may be detected using an optical detection apparatus integrated on a thin substrate, so that the liquid crystal display device may be manufactured to include the optical detection apparatus and the separate purchase of an optical detection terminal my be eliminated. As a result manufacturing costs may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An optical detection apparatus for controlling the backlight of a liquid crystal display device comprising:
    an optical/electric converter transducing light incident on the optical/electric converter into a current flowing to a ground potential;
    a current mirror supplying a mirror output voltage to a current mirror output node in response to an enable signal, the mirror output voltage having a magnitude proportional to the intensity of light incident on the optical/electric converter; and
    a switch connecting a driving node of the current mirror to the ground potential through the optical/electric converter in response to the enable signal,
    wherein the optical/electric converter includes a gate to receive a bias voltage, a drain connected to the switch, and an N-MOS transistor having a source connected to the ground potential.

2. The optical detection apparatus according to claim 1, wherein the current mirror varies the mirror output voltage in proportion to a light intensity incident on the optical/electric converter.

3. The optical detection apparatus according to claim 1, wherein the switch includes an N-MOS transistor having a gate to receive the enable signal, a drain connected to the driving node of the current mirror and a source connected to the optical/electric converter.

4. The optical detection apparatus according to claim 3, wherein the N-MOS transistor switches the driving node of the current mirror to the ground potential in response to a high level voltage of the enable signal applied to the gate of the N-MOS transistor.

5. The optical detection apparatus according to claim 1, further including:
    a reset portion connecting the current mirror output node to the ground potential in response to an inverted enable signal.

6. The optical detection apparatus according to claim 5, wherein the reset portion includes a gate connected to an input node receiving the inverted enable signal, a drain connected to the mirror output node, and N-MOS transistor having a source connected to the ground.

7. The optical detection apparatus according to claim 5, further including:
a load generating unit receiving a bias voltage and converting a mirrored current of the current mirror into the current mirror output voltage.

8. The optical detection apparatus according to claim 7, wherein the load generating unit includes two loader N-MOS transistors series-connected between the current mirror output node and the ground potential, wherein a gate of one of the loader N-MOS transistors is connected to a bias node to receive a bias voltage.

9. A liquid crystal display device, comprising:
an optical detector outputting a detector voltage in proportion to the intensity of light in response to an enable signal;
a driving controller outputting a driving control signal according to the detector voltage and a burst dimming signal;
a lamp driver converting a supply voltage into a lamp driving current having a magnitude varying in accordance with the driving control signal,
wherein optical detector includes:
an optical/electric converter transducing light incident on the optical/electric converter into a current flowing to a ground potential;
a current mirror supplying a mirror output voltage to a current mirror output node in response to an enable signal, the mirror output voltage having a magnitude proportional to the intensity of light incident on the optical/electric converter; and
a switch connecting a driving node of the current mirror to the ground potential through the optical/electric converter in response to the enable signal,
wherein the optical/electric converter includes a gate receiving a bias voltage, a drain connected to the switch, and an N-MOS transistor having a source connected to the ground potential.

10. The liquid crystal display device according to claim 9, wherein the current mirror varies the mirror output voltage in proportion to a light intensity incident on the optical/electric converter.

11. The liquid crystal display device according to claim 9, wherein the switch includes a gate receiving the enable signal, a drain connected to the driving node of the current minor and an N-MOS transistor having a source connected to the optical/electric converter.

12. The liquid crystal display device according to claim 11, wherein the N-MOS transistor switches the driving node of the current mirror to the ground potential in response to a high-level voltage of the enable signal.

13. The liquid crystal display device according to claim 9, further includes:
a reset portion connecting the mirror output node to the ground potential in response to an inverted enable signal.

14. The liquid crystal display device according to claim 13, wherein the reset portion includes a gate connected to an input node to receive the inverted enable signal, a drain connected to the minor output node, and an N-MOS transistor having a source connected to the ground.

15. The liquid crystal display device according to claim 9, further including:
a load generating unit receiving a bias voltage and converting a mirrored current of the current mirror into the current minor output voltage.

16. The liquid crystal display device according to claim 15, wherein the load generating unit includes two loader N-MOS transistors series-connected between the current mirror output node and the ground potential, wherein a gate of one of the loader N-MOS transistors is connected to a bias node to receive the bias voltage.

17. The liquid crystal display device according to claim 9, wherein the driving controller is to output a lamp driving control signal that indicates the lamp driving current needs to be decreased to the lamp driver if a voltage output from the optical detector is increased or to output the lamp driving control signal which indicates the lamp driving current needs to be increased to the lamp driver if a voltage output from the optical detector is decreased.

18. A method of driving a liquid crystal display device comprises:
providing an optical detector including:
an optical/electric converter transducing light incident on the optical/electric converter into a current flowing to a ground potential;
a current mirror supplying a mirror output voltage to a current mirror output node in response to an enable signal, the mirror output voltage having a magnitude proportional to the intensity of light incident on the optical/electric converter; and
a switch connecting a driving node of the current mirror to the ground potential through the optical/electric converter in response to the enable signal;
generating a voltage in proportion to light incident on a liquid crystal display panel of the liquid crystal display device in response to an enable signal using the optical detector;
generating a lamp driving control signal to control the amount of light emitted by the lamps correlated with a magnitude of the voltage; and
controlling the magnitude of a lamp driving current supplied to the lamps in accordance with the lamp driving control signal when the lamps are energized to emit light,
wherein the optical/electric converter includes a gate receiving a bias voltage, a drain connected to the switch, and an N-MOS transistor having a source connected to the ground potential.

19. The method of driving the liquid crystal display device according to claim 18, wherein generating a lamp driving control signal to controlling the amount of light emitted by the lamps correlated with a magnitude of the voltage includes generating a lamp driving control signal which increases as the voltage decreases and decreases as the voltage increases.

* * * * *